United States Patent
Kirchner

(10) Patent No.: US 11,436,476 B2
(45) Date of Patent: Sep. 6, 2022

(54) REFRESHING OF DATA STORED BY MEMRISTORS

(71) Applicant: Robert Bosch GmbH, Stuttgart (DE)

(72) Inventor: Tobias Kirchner, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 646 days.

(21) Appl. No.: 16/532,828

(22) Filed: Aug. 6, 2019

(65) Prior Publication Data

US 2020/0050925 A1 Feb. 13, 2020

(30) Foreign Application Priority Data

Aug. 7, 2018 (DE) .......................... 102018213147.3

(51) Int. Cl.
| | | |
|---|---|---|
| *G11C 11/54* | (2006.01) | |
| *G11C 13/00* | (2006.01) | |
| *G06N 3/063* | (2006.01) | |

(52) U.S. Cl.
CPC ......... *G06N 3/063* (2013.01); *G11C 13/0033* (2013.01)

(58) Field of Classification Search
CPC ...... G06N 3/063; G06N 3/049; G06N 3/0635; G11C 13/0033; G11C 11/5642; G11C 2213/79; G11C 13/004; G11C 11/54; G11C 13/0069

See application file for complete search history.

(56) References Cited

U.S. PATENT DOCUMENTS

| | | | |
|---|---|---|---|
| 2011/0116309 A1* | 5/2011 | Lung ................. | G11C 13/0033 365/163 |
| 2015/0106311 A1* | 4/2015 | Birdwell ................. | G06N 3/08 706/26 |
| 2018/0068217 A1* | 3/2018 | Eleftheriou .......... | G06N 3/0635 |
| 2020/0019845 A1* | 1/2020 | Ito ........................ | G06N 3/0635 |

FOREIGN PATENT DOCUMENTS

| | | |
|---|---|---|
| DE | 102014208609 A1 | 11/2015 |
| DE | 102014211111 A1 | 12/2015 |

* cited by examiner

*Primary Examiner* — Hien N Nguyen
(74) *Attorney, Agent, or Firm* — Norton Rose Fulbright US LLP; Gerard Messina

(57) ABSTRACT

An actuating unit, for a memory that includes at least one memory cell in which one of a plurality of discrete storable values is encodable as an electrical resistance value of a memristor, includes: a measuring device configured to measure the resistance value of the memristor; a discretizer configured to allocate to the measured resistance value one of the plurality of discrete storable values as the read value; a comparator unit configured to ascertain the difference between the nominal resistance value of the memristor that corresponds to the read value and the measured resistance value of the memristor; and a driver configured to apply, to the memristor on the basis of the ascertained difference, a current-time profile that drives the actual resistance value of the memristor in the direction of the nominal resistance value that corresponds to the read value, so that the memory cell is refreshed.

11 Claims, 5 Drawing Sheets

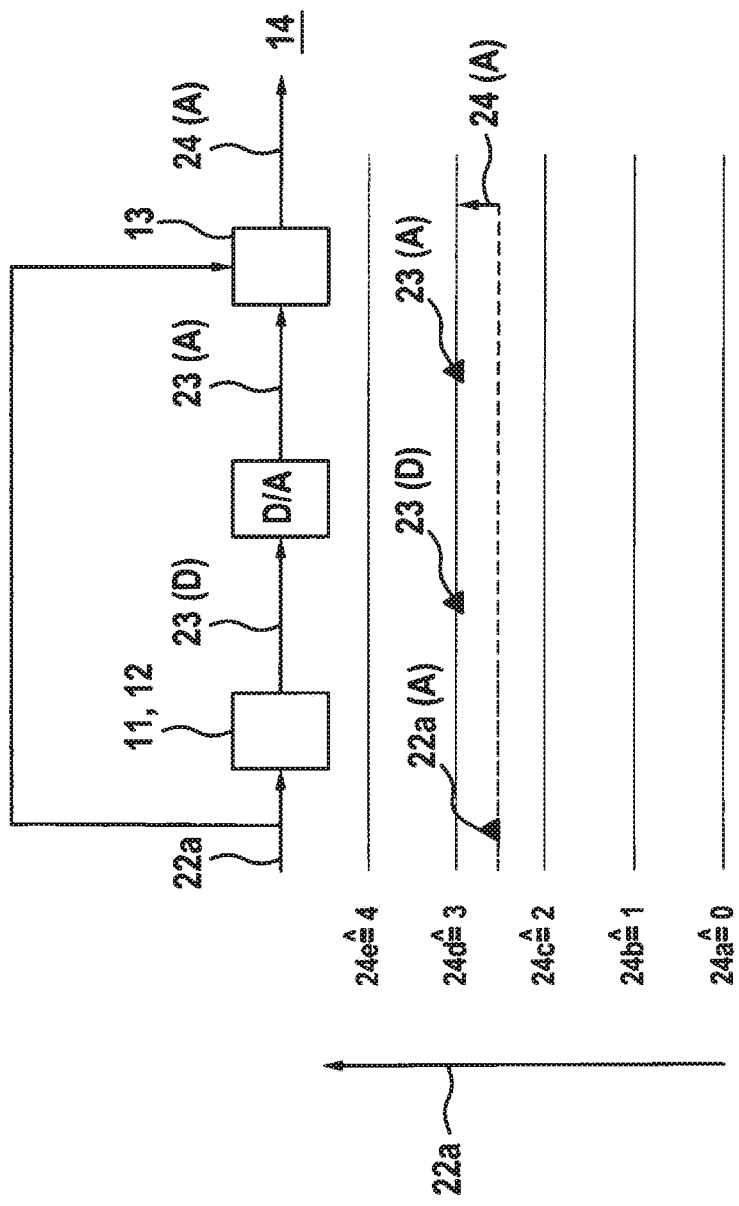

REFRESHING OF DATA STORED BY MEMRISTORS

CROSS-REFERENCE TO RELATED APPLICATIONS

The present application claims priority under 35 U.S.C. § 119 to DE 10 2018 213 147.3, filed in the Federal Republic of Germany on Aug. 7, 2018, the content of which is hereby incorporated by reference herein in its entirety.

FIELD OF THE INVENTION

The present invention relates to an actuating unit for a memristor memory having an additional functionality for the refreshing of stored data.

BACKGROUND

A memristor is a non-volatile memory element which permanently changes its electrical resistance in response to the application of a certain current-time profile. This makes it possible to store data in the memory element. The data can later be read out again from the memory element by measuring the electrical resistance of the memory element.

A lower electrical resistance is physically often adjusted in that a local, better conducting path is generated by the current used for the writing operation, the path leading through a base material of poorer conductivity and bridging this base material so to speak. By reversing the polarity of the current, this path featuring greater conductivity is able to be reduced again.

Depending on the temperature, the atoms or formula units that form the path offering better conductivity have a more or less pronounced tendency to diffuse into the surrounding base material over time. As a result, the long-term stability of the stored data is limited. In the documents DE 10 2014 208 609 A1 and DE 10 2014 211 111 A1, it is therefore proposed to refresh even nominally non-volatile memories such as memristors on a regular basis, that is to say, to actively store the stored data anew in the memory.

SUMMARY

Within the framework of the present invention, an actuating unit has been developed for a memory that has at least one memory cell. In the memory cell, one of a plurality of discrete storable values is encoded in the electrical resistance value of a memristor.

The actuating unit encompasses a measuring device, which is developed to measure the resistance value of the memristor. The measurement of the resistance value is to be understood as any measurement of quantities on the basis of which the resistance value is able to be inferred. For example, if a predefined current is driven through the memristor, the resistance value of the memristor is represented by the voltage drop over the memristor. If a predefined voltage is applied to the memristor, for instance, the resistance value of the memristor is also represented by the current flowing through the memristor. A measurement of the conductivity that is reciprocal to the resistance value is considered a measurement as well.

In addition, the actuating unit includes a discretizer developed to allocate to the measured resistance value one of the plurality of discrete storable values as the read value. Thus, the discretizer maps each measured resistance value to precisely one read value. The more possible read values there are, the more data can be stored in the memory cell. In the simplest case, there are two possible read values by which precisely one bit of data is able to be stored.

Moreover, the actuating unit includes a comparator unit developed to ascertain the difference between the nominal resistance value of the memristor that corresponds to the read value and the measured resistance value of the memristor. This difference is a measure of the extent to which the data stored in the memory cell has already degraded.

For example, a measured quantity that is a measure of the conductivity (i.e., for the reciprocal resistance) can vary in random units between 0 and 4, and the discretizer is able to be developed to round the measured conductivity to the nearest whole number value as the read value. As a result, the five values 0, 1, 2, 3 and 4 are storable in the memory cell. If a conductivity of 2.6 is measured, for instance, then it is allocated the value 3 as the read value. The difference of 0.4 then indicates that the value 3 stored in the memory cell will soon reach the end of its long-term stability. If the conductivity drops even further, down to below 2.5, then it will no longer be allocated the correct value 3 but rather the incorrect value 2 as the read value.

The actuating unit also includes a driver developed to apply a current-time profile to the memristor based on the ascertained difference, which drives the actual resistance value of the memristor in the direction of the nominal resistance value that corresponds to the read value. The memory cell is refreshed in this way. The current-time profile can be a voltage pulse or a sequence of voltage pulses, in particular.

In the mentioned example, this can mean, for instance, that a current-time profile is applied to the memristor in the memory cell such that the conductivity is brought close to the value of 3 again. For the time being, the value 3 stored in the memory cell then has some space against a degradation in both directions, i.e., both against a degradation that increases the conductivity (starting with a conductivity of 3.5, the incorrect value 4 would be detected as the read value) and against a degradation that lowers the conductivity (below a conductivity of 2.5, the incorrect value 2 would be detected as the read value, as described).

Depending on the material of the memristor, the physical mechanism of the degradation can be of such a nature that it has an effect in only one direction. For example, a diffusion in the material of the memristor always leads only to the degradation of conductive paths but not to their orderly renewed development. As a result, diffusion as the degradation mechanism can invariably only reduce the conductivity. When the actual resistance value of the memristor is driven in the direction of the nominal resistance value, it can then be advantageous, for instance, not to stop at this nominal resistance value. Instead, the resistance, or the conductivity, can be driven further, up to a predefined safety margin, to the value range to which the next storable value is allocated as a discrete value. In the mentioned example, the conductivity, for instance, could thus be increased up to 3.4, which is still far enough from the conductivity 3.5 to which the value 4 would already be allocated as a read value. If the conductivity starts at 3.4 instead of 3 following the refreshing, then it takes considerably longer for the degradation to lower it back again to 2.6 and for the next refreshing to be required.

It was recognized that the described actuating unit improves the long-term stability of the data stored in the memory, especially in applications in which one of three or more different storable values is stored in the memory cell. The more different values are storable in the memory unit, the closer the associated nominal resistance values move to one another, and the faster a degradation in the memristor causes the readout of a value from the memory cell that differs from the originally stored value.

This is particularly true for applications in the area of neural networks. In applications of that type, the result of learning manifests itself in weights of connections between neurons. These weights are often not binary but can assume more than two discrete values. If these weights are stored in the form of electrical resistance values of memristors, then a degradation in the memristor can cause the behavior of the neural network not to be permanently deterministic but to change in an unpredictable manner when a weight "flips" to the next discrete value.

Such "flipping" would alternatively also be caught by transferring the neural network into a form in which it is permanently learning. One pertinent example are networks on the basis of "spike timing dependent plasticity" (STDP) weighting connections entering a neuron as a function of whether the corresponding inputs can be temporally causal to the output of the neuron. In this continuous learning process, the effect of the "flipping" of individual weights is at least partially able to be compensated for in a dynamic manner.

However, it was recognized that it is more advantageous to ensure the long-term stability of the data stored in the memory using the described actuating unit. That way, the learning phase of the neural network is able to be clearly delimited from the subsequent inference phase, which constitutes the normal operation of the network. The behavior of the network in this inference phase then remains deterministic. In contrast, a neural network that is in a permanent learning mode also during a normal operation is able to be retrained solely by the current of the inputs that arise during a normal operation, the effect not always being predictable and also not always being desired.

For example, during a normal operation, particular traffic signs that are encountered most often by the appropriately equipped vehicle are frequently applied to a neural network employed to detect traffic signs. Each traffic sign not only appears in its nominal "pure form" but also in a multitude of slight variations such as they can result from soiling, slight damage, graffiti, or the application of stickers, for example. These variations can draw the "attention" of a continually learning neural network, which could be at the expense of traffic signs that are encountered on rare occasions. For example, a multitude of variations of frequently encountered traffic signs can result in a misidentification of that which is represented by a sign. For example, the German "unprotected water's edge" traffic sign 129, which warns of an "unprotected water's edge," can be confused with the German give way "yield" traffic sign 205, so that a vehicle driving in a fully or partially automated mode can then possibly roll into the water.

However, such undesired "relearning" does not occur if the learning phase and the inference phase of the neural network are clearly separated from each other, and if the long-term stability of the learning result is ensured in some other manner, i.e., by the described actuating unit developed for the refreshing. This is advantageous in particular with regard to the official certification of neural networks for at least partially automated driving.

In an example embodiment, the discretizer is developed to allocate one of at least three different storable values to the measured resistance value as the read value. Between three and ten, and most preferred, between three and five storable values are preferably provided. As mentioned earlier, this particularly allows for the storage of weights for connections in neural networks that provides stability over the long term.

One motivation for using memristors for the storing of the weights in the first place is the possibility of implementing neural networks in the form of rapid analog electronics.

In an example embodiment, both the nominal resistance value of the memristor and the measured resistance value of the memristor are therefore present in analog form, and the comparator unit is developed to output the difference in analog form. In particular, the driver can include an analog circuit for converting the difference into the current-time profile. The refreshing can then be carried out entirely in an analog manner.

However, the difference and the resulting current-time profile are also able to be ascertained in a digital manner. Toward this end, a combination of measuring device, discretizer, and comparator unit can be realized using an analog-digital converter, which has a finer resolution than required for the differentiation between the discrete values storable in the memory cell. The analog-digital converter then supplies each measured value for the resistance of the memristor in the form of a digital data word. For example, the higher-value bits of this data word are then able to be used for distinguishing between the storable discrete values, while the low-value bits directly represent the difference.

If a data word encompasses 8 bits, for instance, then it is possible to represent the resistance of the memristor in multiples of 32 using the highest-value three bits. Considering only the highest-value three bits and discarding the remaining five bits makes it possible to discretize the resistance directly to the eight resistance values 0, 32, 64, 96, 128, 160, 192 and 224. The memristor is then advantageously actuated in such a way that these eight resistance values are the nominal resistance values which are allocated to the eight values 0 through 7 storable in the memory cell.

In an ideal memristor offering long-term stability, the five low-value bits should all be 0 in each measurement of the resistance value, as is the case for the nominal resistance values. If a degradation increases the resistance, this will no longer be the case. The five low-value bits thus indicate a measure of the error caused by the degradation, i.e., the difference, directly in digital form. At the same time, it can be directly gathered from the highest-value three bits which one of the eight possible values is the value read from the memory cell.

As a result, it is possible to ascertain the read value on the one hand, and the difference on the other without any computing operations, simply by subdividing the bits of the data word. The speed disadvantage in comparison with a purely analog processing operation is therefore minimized. The digital processing in turn is advantageous for the digital control of the current-time profile to be applied to the memristor.

In an example embodiment, the driver is developed to control the resistance value of the memristor to a setpoint value. For instance, this means that the driver alternatingly applies current-time profiles to the memristor and initiates a new measurement of the resistance value of the memristor, this procedure being repeated until the agreement of this resistance value with the setpoint value satisfies a termination condition. As previously described, the setpoint value can be the nominal resistance value that corresponds to the read value. However, the setpoint value can also be shifted beyond the nominal resistance value (toward a higher conductivity in the above example) within the band of resistance values that are still allocated to the read value, in an effort to achieve more space with regard to a degradation that has an effect in only one direction.

The active control tendentially takes up more time but has an advantage of adapting itself to physical changes in the material of the memristor. Such materials, for one, can be subject to ageing processes. For another, the response behavior of the material to one and the same current-time profile can also depend on the prior history of the current-time profiles that have already been applied to the material in the past. The active control makes it possible to adapt the used current-time profiles to this longer-term development.

In an example embodiment, in response to a lack of refreshment of least one memory cell for a predefined period of time, the actuating unit is furthermore developed to refresh this memory cell. In this manner it can particularly be ensured that even the contents of memory cells that are accessed very rarely remains stable over the long term. The predefined time period depends on the material of the memristor and the physical mechanism by which the electrical resistance of this memristor is varied. It is by orders of magnitude longer than the refresh cycle in DRAM memories and can lie in a range of days or weeks, for instance.

The actuating unit is advantageously able to be connected to a temperature sensor for a temperature of the memory and developed to adapt the predefined time period as a function of this temperature or a time characteristic of this temperature. Especially diffusion processes as degradation processes heavily depend on the temperature.

According to the above description, the present invention also relates to a hardware platform for an artificial neural and/or neuromorphic network whose internal processing chain includes a multitude of neurons that are connected to one another. More specifically, a neuromorphic network is to be understood as a network in which a neuron outputs an event in response to the fact that the presented stimulation on the input side exceeds a predefined threshold value. Such networks are also referred to as "spiking neural networks" and are comparable to event-based image sensors, for example. Such image sensors are subdivided into pixels, and whenever the light intensity incident on a pixel changes by a certain percentage amount, the image sensors output an event allocated to this pixel.

The hardware platform includes at least one memory in which weights, present as discrete values, of connections between neurons are encoded in the form of electrical resistance values of memristors. Provided in addition is the described actuating unit, which ensures the long-term stability of the stored weights in the previously described manner.

However, the application area of memories that include the described actuating unit is not limited to neural networks but in particular quite generally encompasses analog computing modules whose behavior is defined by parameters stored in a memory.

Therefore, the present invention also relates to an analog computing module, which allocates one or more output signals to one or a plurality of analog input signals in accordance with at least one computing operation. The at least one computing operation and/or at least one discrete parameter specifying this computing operation is/are encoded in a memory in the form of at least one electrical resistance value of a memristor. The memory is coupled with the described actuating unit.

For example, the analog computing module can be developed to calculate a cross product of two vectors or matrices. In the digital domain, this calculation requires a multitude of operations to be executed in sequence. In the analog domain, all components of the operands can be available simultaneously, for instance in the form of currents, and all components of the result can likewise be formed at the same time.

It holds true for all application areas that the term "actuating unit" should not be given a restrictive interpretation to the effect that this unit has to sit at a particular location or that all of its parts must be combined on a hardware module. Instead, it suffices to logically interconnect a measuring device, a discretizer, a comparator unit, and a driver in such a way that an actuating unit having the described function is formed. If a measuring device, a discretizer, a comparator unit, or a driver are already present, such as for the normal operation of the memory, then a second function is able to be assigned to these components for use in the actuating unit. For example, the actuating unit can also be integrated into a neural network that stores weights of connections between neurons in the memory.

As a result, the realization of the actuating unit can particularly be achieved entirely or partially in software that controls the existing hardware in a different manner. This software, for instance, can be distributed as an add-on, an update, or an upgrade for existing hardware and thus is a product that can be marketed on its own. Therefore, the present invention also relates to a computer program including machine-readable instructions which, when executed on a computer and/or on a control unit and/or in an embedded system, upgrades the computer, the embedded system, or the control device to the described actuating unit. In the same way, the present invention also relates to a machine-readable data carrier or a download product with the computer product.

In the following text, measures that improve the present invention will be illustrated in greater detail together with the description of example embodiments of the present invention using figures.

BRIEF DESCRIPTION OF THE DRAWING

FIG. 5 illustrates processing of a resistance value in an actuating unit according to an example embodiment of the present invention.

DETAILED DESCRIPTION

Figure 1:
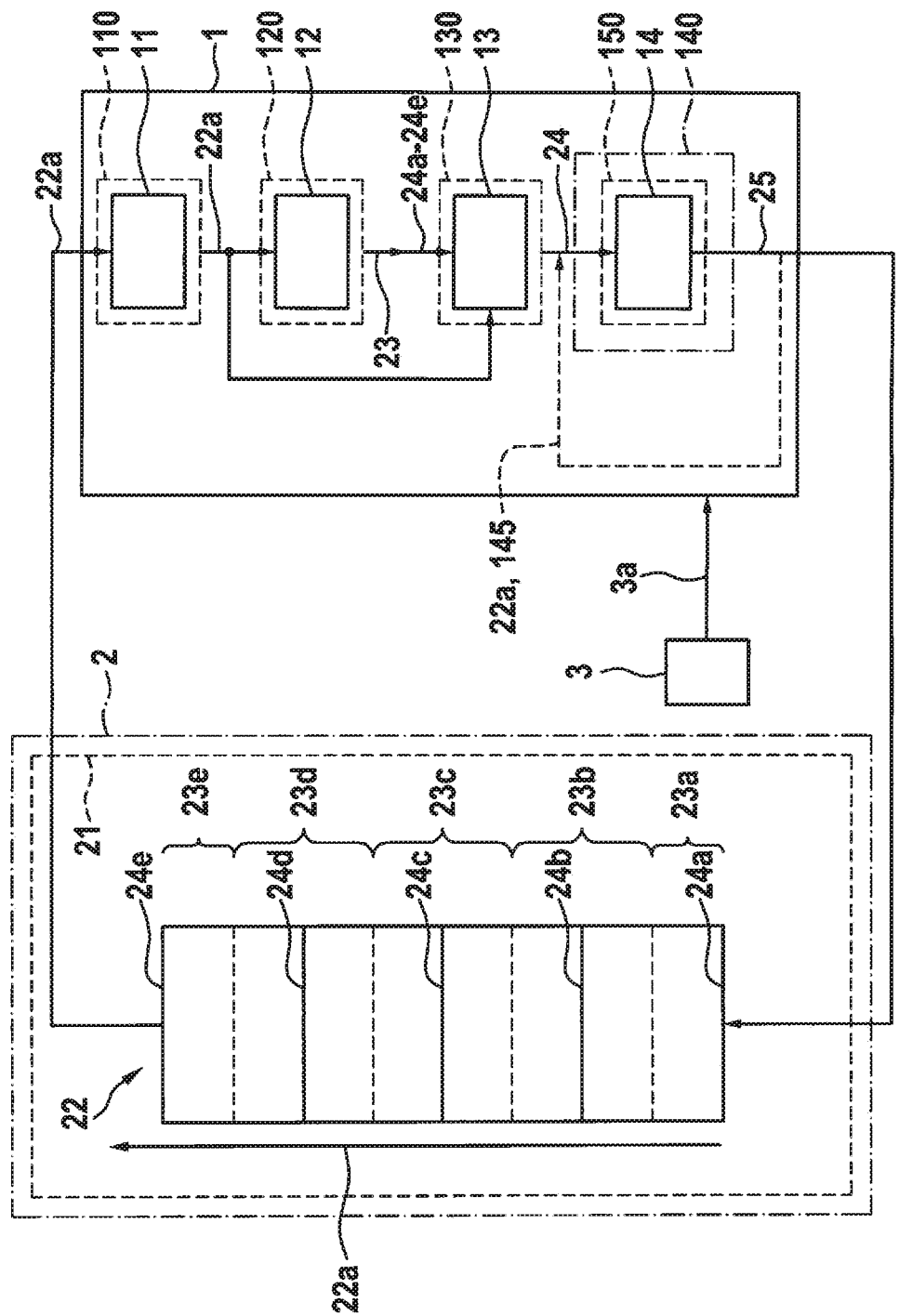
FIG. 1 illustrates an actuating unit 1 in cooperation with a memory according to an example embodiment of the present invention.

According to FIG. 1, exemplary memory 2 actuated by actuating unit 1 includes a single memory cell 21 whose central element is a memristor 22. The data stored in memory cell 21 is encoded in resistance value 22a of memristor 22.

In the example illustrated in FIG. 1, five different values 23a-23e are storable in memory cell 21. In actuating unit 1, each one of values 23a-23e is detected as read value 23 at the precise moment when measured resistance 22a of memristor 22 lies in the range associated with respective value 23a-23e on the scale of resistance 22a. In addition, a nominal resistance value 24a-24e is also allocated to each value 23a-23e, which is set when the value 23a-23e is written into memory cell 21.

After its resistance 22a has been set to one of nominal resistance values 24a-24e, an ideal, infinitely long-term stable memristor 22 would keep this resistance value 24a-24e until the data stored in memory cell 21 is intentionally modified. In reality, however, resistance 22a drifts away from respective nominal value 24a-24e over time. It is the task of actuating unit 1 to detect such deviations and to actively remedy them before they reach a level that leads to an incorrect detection of the data stored in memory cell 21.

Toward this end, resistance 22a of memristor 22 is first measured in step 110 using measuring device 11. In step 120, discretizer 12 ascertains value 23 read from memory cell 21, as described earlier in the text. In step 130, comparator unit 13 ascertains difference 24 between nominal resistance value 24a-24e corresponding to read value 23 on the one hand, and actual resistance value 22a on the other. In step 140, using difference 24, driver 14 ascertains current-time profile 25 to be applied to memristor 22 in order to drive its resistance value 22a in the direction of nominal resistance value 24a-24e corresponding to read value 23. This ascertainment can also be carried out in a purely analog manner according to optional step 150.

According to optional step 145, resistance value 22a is able to be actively controlled to a new setpoint value, i.e., the ascertainment and application of current-time profiles 25 is repeated until this setpoint value has been reached with sufficient accuracy.

In order to determine when memory cell 21 is to be next refreshed in such a manner, actuating unit 1 is connected to a temperature sensor 3. Temperature sensor 3 is thermally coupled to memory 2 and supplies temperature 3a of memory 2 to actuating unit 1.

Figure 2:
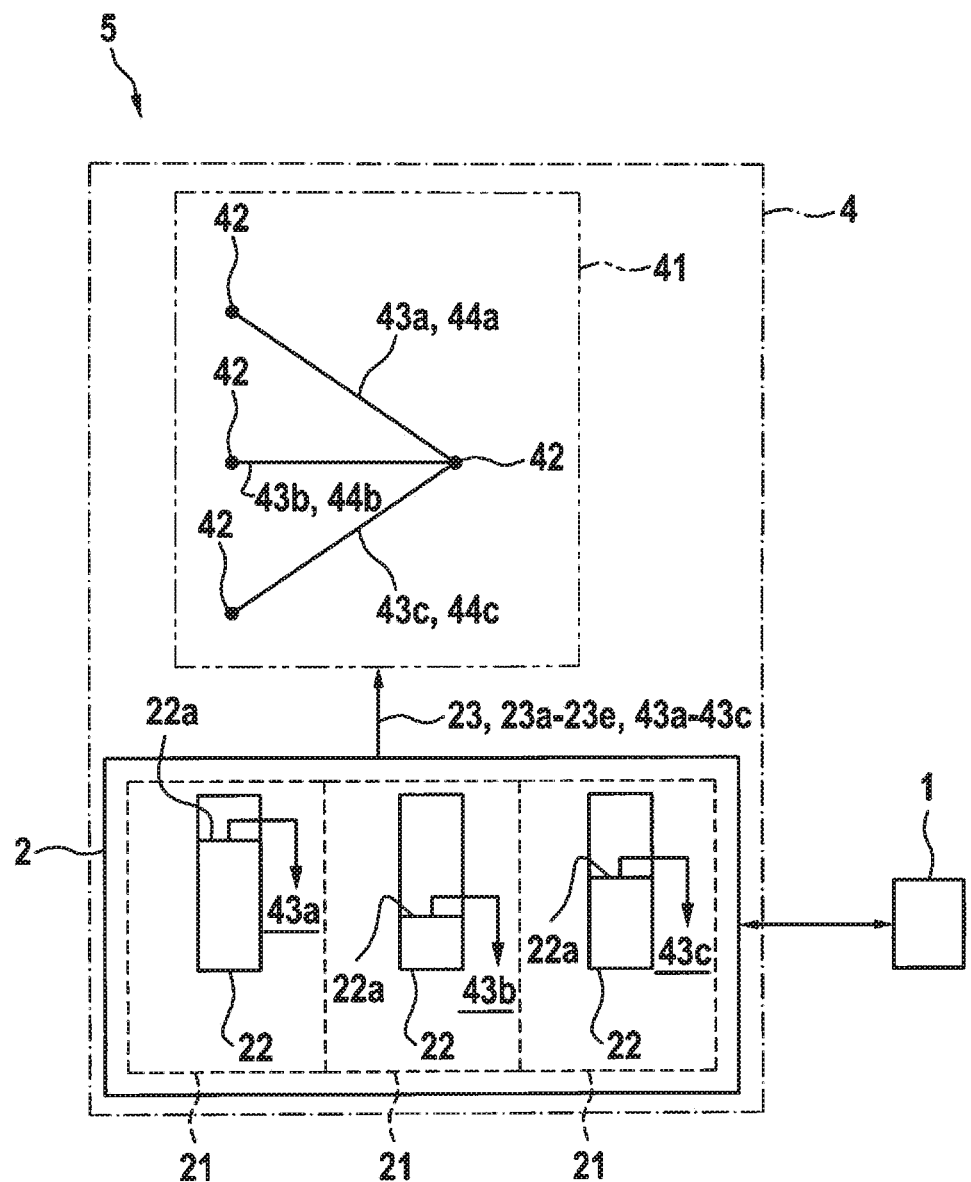
FIG. 2 illustrates a hardware platform for a neural network according to an example embodiment of the present invention.

FIG. 2 shows an exemplary hardware platform 5 for a neural network 4. Internal processing chain 41 of neural network 4 includes a multitude of neurons 42, of which only a few are shown in FIG. 2 together with their connections 44a-44c to one another. Associated weights 43a-43c, which in turn are stored in memory 2, are applied to connections 44a-44c. Memory 2 encompasses three memory cells 21 having a memristor 22 in each case. Thus, weights 43a-43c are encoded in resistance values 22a of memristors 22 in memory cells 21, and read value 23 is discretized to one of possible values 23a-23e. Memory 2 is coupled to actuating unit 1.

Figure 3:
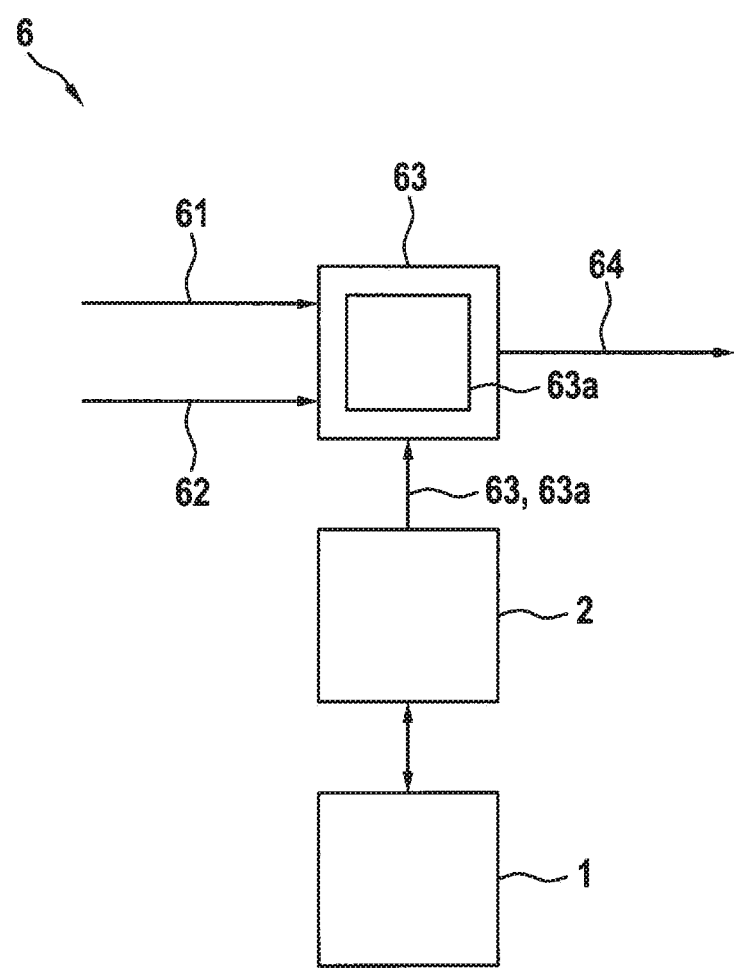
FIG. 3 illustrates an analog computing module 6 according to an example embodiment of the present invention.

FIG. 3 shows an exemplary analog computing module 6. Two exemplary operands 61 and 62 are processed into a result 64 by a computing operation 63 parameterized by a parameter 63a. Computing operation 63 and associated parameter 63a are stored in memory 2, which is coupled to actuating unit 1.

Figure 4:
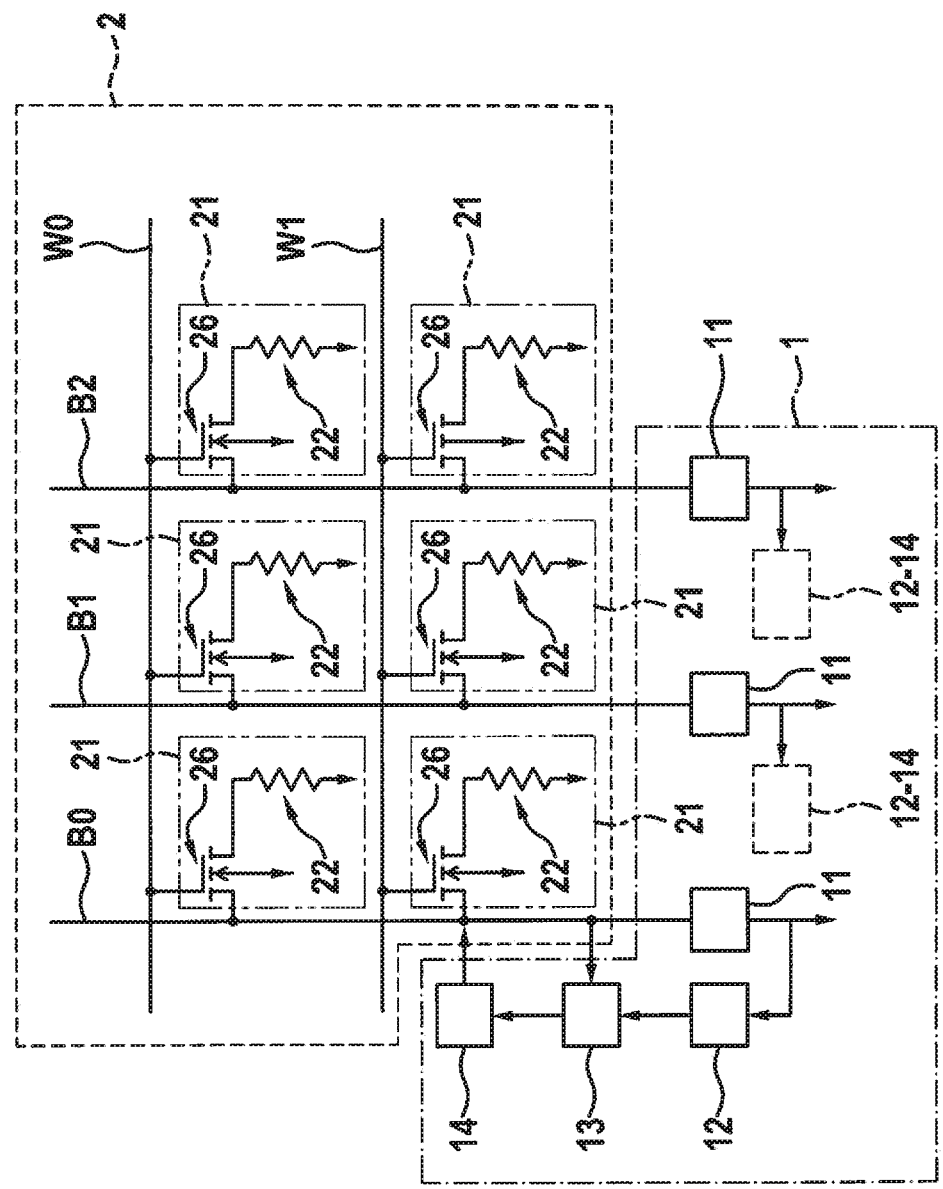
FIG. 4 illustrates integration of an actuating unit into a memory has a plurality of memory cells, according to an example embodiment of the present invention.

FIG. 4 shows an exemplary integration of actuating unit 1 with a memory 2, which includes a plurality of memory cells 21. Each memory cell 21 is connected to precisely one of word lines W0 and W1 and also to precisely one of bit lines B0, B1, B2. Through a simultaneous actuation of a word line W0, W1 and a bit line B0, B1, B2, a memory cell 21 is selected. Toward this end, each memory cell 21 includes an actuation transistor 26 in addition to memristor 22.

Components 11, 12, 13, and 14 associated with actuating unit 1 are present once per bit line B0, B1, B2.

FIG. 5, by way of example, shows the ascertainment of a difference 24 for the refreshment. Similar to FIG. 1, the five nominal resistance values 24a-24e corresponding to storable values 0, 1, 2, 3, and 4 have been plotted on the scale of resistance value 22a of memristor 22. A measured resistance value 22a is now digitized using the combination of measuring device 11 and discretizer 12 and converted into a read value 23(D). Since measured resistance 22a lies closest to level 24d, the value read from memory cell 21 is the value 3 to which level 24d corresponds. Using a D/A converter, this resistance value 24d is converted into an analog value 23(A), which is compared to the originally measured resistance value 22a in comparator unit 13. The analog difference 24(A) is transmitted to driver 14 so that memory cell 21 is able to be refreshed appropriately.

What is claimed is:

1. An actuating unit for a memory, the memory including at least one memory cell, one of a plurality of discrete storable values being encodable in the memory cell by an electrical resistance value of a memristor, the actuating unit comprising:
    a sensor, wherein the sensor is configured to measure a resistance value of the memristor;
    a discretizer, wherein the discretizer is configured to allocate to the measured resistance value one of the plurality of discrete storable values as a read value;
    a comparator, wherein the comparator is configured to ascertain a difference between (a) a nominal resistance value of the memristor that corresponds to the read value and (b) the measured resistance value of the memristor; and
    a driver, wherein the driver is configured to refresh the memory cell by applying, to the memristor and based on the ascertained difference, a current-time profile that drives the resistance value of the memristor towards the nominal resistance value that corresponds to the read value.

2. The actuating unit of claim 1, wherein the discretizer is configured to allocate one of at least three different storable values to the measured resistance value as the read value.

3. The actuating unit of claim 1, wherein both the nominal resistance value of the memristor and the measured resistance value of the memristor are in analog form, and the comparator is configured to output the ascertained difference in analog form.

4. The actuating unit of claim 3, wherein the driver includes an analog circuit for converting the ascertained difference into the current-time profile.

5. The actuating unit of claim 1, wherein the driver is configured to control the resistance value of the memristor to a setpoint value.

6. The actuating unit of claim 1, wherein the actuating unit is configured to refresh the memory cell in response to a lack of refreshment of the memory cell for a predefined period of time.

7. The actuating unit of claim 6, wherein the actuating unit (a) is configured to be connected to a temperature sensor and (b) is configured to adapt the predefined time period as a function of a temperature of the memory measured by the temperature sensor or a time characteristic of the temperature of the memory measured by the temperature sensor.

8. A hardware platform for a network that is at least one of an artificial neural network and a neuromorphic network, the network including an internal processing chain that includes a plurality of neurons that are connected to one another, the hardware platform comprising:
    at least one memory in which weights, present as discrete values, of connections between neurons are encoded in the form of electrical resistance values of memristors; and an actuating unit comprising a sensor, a discretizer, a comparator, and a driver, wherein, for each of the memristors:

the sensor is configured to measure a resistance value of the respective memristor;

the discretizer is configured to allocate to the respective measured resistance value one of the discrete storable values as a read value;

the comparator is configured to ascertain a difference between (a) a nominal resistance value of the respective memristor that corresponds to the read value and (b) the measured resistance value of the respective memristor; and the driver is configured to refresh a memory cell of the respective memristor by applying, to the respective memristor and based on the ascertained difference, a current-time profile that drives the resistance value of the respective memristor towards the nominal resistance value that corresponds to the read value of the respective memristor.

9. An analog computing module comprising:

a memory; and an actuating element comprising a sensor, a discretizer, a comparator, and a driver;

wherein:

the analog computing module is configured to allocate one or a plurality of output signals to one or a plurality of analog input signals in accordance with at least one computing operation;

the at least computing operation and/or at least one discrete parameter specifying the computing operation is encoded in the memory in the form of at least one of a plurality of discrete storable values that each is a respective electrical resistance value of a memristor of the memory;

the sensor is configured to measure a resistance value of the memristor;

the discretizer is configured to allocate to the measured resistance value one of the discrete storable values as a read value;

the comparator is configured to ascertain a difference between (a) a nominal resistance value of the memristor that corresponds to the read value and (b) the measured resistance value of the memristor; and the driver is configured to refresh a memory cell of the memristor by applying, to the memristor and based on the ascertained difference, a current-time profile that drives the resistance value of the memristor towards the nominal resistance value that corresponds to the read value of the memristor.

10. The analog computing module of claim 9, wherein the analog computing module is configured to calculate a cross product of two vectors or a matrix product of two matrices.

11. A non-transitory computer-readable medium on which are stored instructions that are executable by a processor and that, when executed by the processor is configured to cause the processor to perform a method of an actuating unit for a memory, the memory including at least one memory cell, one of a plurality of discrete storable values being encodable in the memory cell by an electrical resistance value of a memristor, the method comprising:

obtaining a resistance value of the memristor;

allocating to the measured resistance value one of the plurality of discrete storable values as a read value;

ascertaining a difference between (a) a nominal resistance value of the memristor that corresponds to the read value and (b) the measured resistance value of the memristor; and refreshing the memory cell by applying, to the memristor and based on the ascertained difference, a current-time profile that drives the resistance value of the memristor towards the nominal resistance value that corresponds to the read value.

* * * * *